US012768865B2

(12) United States Patent
Vicente Oliveros et al.

(10) Patent No.: US 12,768,865 B2
(45) Date of Patent: Oct. 20, 2026

(54) ELECTRICAL VOLTAGE MEASURING DEVICE USING AN MICROELECTROMECHANICAL SYSTEM AND OPTICAL INTERFEROMETER INTERACTION

(71) Applicant: AIRBUS OPERATIONS, S.L.U., Getafe (ES)

(72) Inventors: David Vicente Oliveros, Getafe (ES); Carlos Andres Gonzalez, Getafe (ES); Salvador Sales Maicas, Valencia (ES); Angel Hector Garcia Miquel, Valencia (ES); Jorge Daniel Martinez Perez, Valencia (ES)

(73) Assignee: AIRBUS OPERATIONS S.L.U., Getafe (ES)

( * ) Notice: Subject to any disclaimer, the term of this patent is extended or adjusted under 35 U.S.C. 154(b) by 110 days.

(21) Appl. No.: 18/396,946

(22) Filed: Dec. 27, 2023

(65) Prior Publication Data

US 2024/0219431 A1 Jul. 4, 2024

(30) Foreign Application Priority Data

Dec. 29, 2022 (ES) .................................. 202231114

(51) Int. Cl.

*G01R 15/24* (2006.01)
*B81B 7/02* (2006.01)
*G01R 19/00* (2006.01)

(52) U.S. Cl.

CPC ................ *G01R 15/24* (2013.01); *B81B 7/02* (2013.01); *G01R 19/0084* (2013.01); *B81B 2201/0292* (2013.01)

(58) Field of Classification Search

CPC ...... G01R 15/24; G01R 19/0084; B81B 7/02; B81B 2201/0292

See application file for complete search history.

(56) References Cited

U.S. PATENT DOCUMENTS 4,724,318 A * 2/1988 Bennig .................. G01Q 60/38 977/863
4,823,004 A * 4/1989 Kaiser .................... B82Y 35/00 850/16

(Continued)

FOREIGN PATENT DOCUMENTS

JP H11351958 A 12/1999
JP 2001133486 A 5/2001

OTHER PUBLICATIONS

Nano-Opto-Electro-Mechanical Systems by Midolo et al. (Year: 2018).*

(Continued)

*Primary Examiner* — Paresh Patel

(74) *Attorney, Agent, or Firm* — Greer, Burns & Crain, Ltd.

(57) ABSTRACT

An electrical voltage values measuring device having at least one microelectromechanical device comprising a first electrode connectable to an anode of an electrical voltage source and a second electrode connectable to a cathode of the electrical voltage source, wherein the microelectromechanical device is configured to receive an electrical voltage from the electrical voltage source causing a deviation of the first electrode, associated with the electrical voltage, wherein the deviation causes a distance variation between the first electrode and the second electrode, and an optical processor that comprises a laser and an optical sensor.

12 Claims, 4 Drawing Sheets

(56) References Cited

U.S. PATENT DOCUMENTS

| | | | | | |
|---|---|---|---|---|---|
| 4,935,634 | A * | 6/1990 | Hansma | G01Q 70/04 | 977/863 |
| 5,265,470 | A * | 11/1993 | Kaiser | G01P 15/133 | 33/300 |
| 5,293,781 | A * | 3/1994 | Kaiser | G01P 15/133 | 73/178 R |
| 5,315,247 | A * | 5/1994 | Kaiser | G01P 15/133 | 977/852 |
| 5,476,006 | A * | 12/1995 | Fujii | G01Q 30/14 | 250/307 |
| 5,838,484 | A | 11/1998 | Goossen | | |
| 8,168,120 | B1 * | 5/2012 | Younis | G01N 29/022 | 422/68.1 |
| 2005/0237538 | A1 | 10/2005 | Belleville | | |
| 2006/0192974 | A1 * | 8/2006 | Li | G01D 5/268 | 73/514.27 |
| 2011/0170108 | A1 | 7/2011 | Degertekin | | |

OTHER PUBLICATIONS

Hao Yan, Balanced-Bridge Method for the Characterization of Dielectric Charging in RF MEMS Cantilever Switches, IEEE Sensors Journal, vol. 20, No. 4, Feb. 15, 2020.
Aamir Saud Khan, Arc-Shaped Cantilever Beam RF MEMS Switch for Low Actuation Voltage, Proceedings of 2017 IEEE International Conference on Circuits and Systems (ICCS 2017).
Akanksha D. Singh et al., Design and Fabrication of PDMS-based electrostatically actuated MEMS cantilever beam, Micro & Nano Letters, 2020, vol. 15, Iss. 5, pp. 302-307.
Leonardo Midolo et al, Nano-opto-electro-mechanical systems, Nature Nanotechnology, 13, 11-18 (2018) (abstract only).

* cited by examiner

ELECTRICAL VOLTAGE MEASURING DEVICE USING AN MICROELECTROMECHANICAL SYSTEM AND OPTICAL INTERFEROMETER INTERACTION

CROSS-REFERENCES TO RELATED APPLICATIONS

This application claims the benefit of Spanish Patent Application Number P202231114 filed on Dec. 29, 2022, the entire disclosure of which is incorporated herein by way of reference.

FIELD OF THE INVENTION

The present invention consists of an electrical voltage measuring device using microelectromechanical and optical devices (optical interferometry).

BACKGROUND OF THE INVENTION

Microelectromechanical systems (MEMS) are micrometric devices that usually contain moving parts, as well as detection and processing units of the information to be detected. MEMS can be used for a wide variety of applications ranging from ink deposition in printers to inertial measurement (accelerometers and gyroscopes). Its micrometer scale allows easy installation and implementation in combination with optical interferometry.

Optical interferometry is a technique based on the analysis of the interference patterns that occur between two light beams, where one of the light beams undergoes a variation in amplitude and/or phase that depends on the conditions of the reflection surface, whether its distance or roughness.

Disadvantageously, conventional methods for electrical voltage measurement use active electronic components that require a power supply and therefore pose a fire threat through spark generation, overheating and short circuits. Therefore, for electrical voltage measuring in fuel cells, the ability to measure electrical voltage by micromechanical and optical methods exclusively would greatly increase safety.

Disadvantageously, conventional multi-point electrical voltage measuring techniques often require a large number of power lines, since each sensor has to be part of an isolated circuit. When the number of measuring points increases, for example, to measure the individual output of each element of a voltage source composed of multiple cells, the number of power lines increases considerably, increasing the complexity of the wiring system and its installation, as well as such as its weight, cost and maintenance.

Thus, there is a demand for small-scale strain gauges obtaining measurements with a high level of accuracy, that are safe, easily scalable, that have a low manufacturing cost and that use non-electrical measurement methods.

The present invention meets this demand.

SUMMARY OF THE INVENTION

The present invention relates to an electrical voltage measuring device proportional to a mechanical displacement of a microelectromechanical device (MEMS), where this mechanical displacement is detectable and measurable through optical interferometry. The electrical voltage measuring device may comprise one or more microelectromechanical devices, since it allows its scalability.

The tension values are obtained by analyzing the optical interference patterns affected by said mechanical variation and obtained by means of an optical processor.

The invention relates to an electrical voltage measuring device, comprising at least one microelectromechanical device comprising a first electrode connectable to an anode of an electrical voltage source and a second electrode connectable to a cathode of said electrical voltage source, where the microelectromechanical device is configured to receive an electrical voltage from the electrical voltage source causing displacement of the first electrode with respect to a laser light injection point on the first electrode.

Said displacement of the first electrode, or mobile electrode, causes a distance variation between the first electrode and the second electrode, or fixed electrode, which is a function of the electrical voltage applied to the two electrodes of the MEMS. The optical processor, which comprises a laser and an optical sensor, is configured to project by means of the laser a light beam through a laser light injection point onto the first electrode.

The light beam reflected from the mobile electrode and the light beam reflected from the fiber-optic-air interface creates an optical interference pattern that will depend on the displacement of the mobile electrode. These interference patterns will be detected with the optical sensor and based on these measurements the electrical voltage applied to the MEMS electrodes will be determined. The optical sensor is configured to obtain the interference patterns and calculate the value of the applied electrical voltage.

The reflection surface of the laser light beam will be the mobile electrode of the MEMS, which will vary depending on the electrical voltage applied between the two electrodes of the MEMS. One light beam will be reflected from the moving electrode of the MEMS and the other light beam will be reflected from the fiber-air interface. An optical interference pattern will be created between both light beams that will depend on the displacement of the mobile electrode and, therefore, on the electrical voltage applied to the MEMS electrodes.

In one example, the optical fiber comprises a plurality of optical terminals configured to capture the light beam reflected at the fiber-air interface and the reflection of the light beam on the surface of the moving electrode, as well as an optical multiplexer comprising an output connected to the optical processor. In one example, the optical multiplexer is spatial.

In a first configuration, the moving electrode is configured as a conductive cantilever comprising a free end or cantilever end. The laser is configured to project the light beam through a laser light injection point onto an area at the end of the cantilever (moving electrode). The displacement of this mobile electrode with respect to the laser light injection point causes a structural deviation $\Delta Z(V)$ of the cantilever end. The laser light injection point may be included at one end of the optical fiber.

In a second configuration, the first mobile electrode is fixed to the structure at both ends, the central part of the electrode moving based on the electrical voltage applied between the mobile electrode and the fixed electrode. The laser is configured to project the light beam through a laser light injection point onto the moving electrode by means of an optical fiber comprising the laser light injection point at one end. The end of said optical fiber is located at a distance L of the moving electrode. The displacement of the first electrode includes a distance variation $\Delta L(V)$ between the two electrodes of the MEMS.

In one example, the microelectromechanical device is a capacitive MEMS formed by two electrodes separated by, for example, 1 to 2 microns. A first electrode is fixed, while the other is mobile depending on the electrical voltage applied between both electrodes. The distance between electrodes varies based on the electrical voltage applied between the MEMS electrodes. Said electrical voltage will be that corresponding to the battery or fuel cell that is intended to be measured. The displacements originated in the mobile electrode of the MEMS due to the electrical voltage to be measured will be a function of this electrical voltage, and will be measured by means of optical interferometry using the optical processor.

The main advantage of the device, according to the present invention, is that it allows electrical voltage measuring without the use of electronic circuits, that is, only through microelectromechanical, purely mechanical, devices, and optical interferometry using an optical processor. The device, according to the present invention, simultaneously allows electrical voltage measuring over long distances, by transmitting the information via optical fiber. This feature provides security in electrical voltage measuring in fuel cells by performing the measurement using micromechanical and optical devices, which do not incorporate an electrical power supply.

The microelectromechanical device comprises, in a particular embodiment, a capacitive MEMS where one of the electrodes moves based on the electrical voltage to be measured. The displacement of this electrode is measured through optical interferometry thanks to the optical processor that includes means to be used as an optical interferometer. The optical interferometer will consist of the use of a single-mode optical fiber excited by a laser that will be reflected, in part, in the mobile electrode and, in part, in the fiber-air interface. Using the interferometry created in the fiber, the displacement of the mobile electrode will be measured. The relationship between displacement of the moving electrode and voltage in the MEMS can be previously characterized. Fibers with multiple cores can be used to make several simultaneous measurements at different points of the MEMS and obtain the average of the measurements, reducing the error in the measurement.

The optical processor comprises a laser and an optical receiver or sensor and at least one optical fiber excited by said laser to project a light beam through a laser light injection point on the moving electrode of the MEMS. The capacitive MEMS is configured to apply the voltage to be measured between its electrodes (between the fixed electrode and the mobile electrode), causing a distance variation between electrodes that will be a function of the electrical voltage to be measured. This distance variation between MEMS electrodes will be measured using the optical interferometer.

Therefore, the electrical voltage measuring device comprises a capacitive MEMS and an optical interferometer. Using the interferometer, based on optical fibers, the interference patterns will be obtained between the light beam reflected on the mobile electrode of the MEMS and the light beam reflected at the interface of the optical fiber with the air (at the end of the optical fiber pointing at the MEMS electrode). In this way, the interference patterns are obtained based on the light beam and the reflection of the light beam affected by the geometric variations of the MEMS and the value of the voltage to be measured is obtained based on these interference patterns.

Advantageously, the optical interferometry carried out by the optical processor does not require a power supply at the measuring point and therefore minimizes the risk of fire through the generation of sparks, overheating and short circuits, which is important in applications where highly flammable substances are present, for example hydrogen (hydrogen fuel cells), or in any other environment where there is danger of explosion or fire.

The optical signal from the optical processor functioning as an interferometer can be transmitted remotely through the optical fiber, so that the electrical processing of the optical signal from the interferometer can be carried out remotely, where the security requirements present in the storage area of the fuel cells are not in place (it is important that in the area where the fuel cells are located there are no electrically powered devices that could cause explosions due to possible short circuits).

In a second example, the electrical voltage measuring device comprises a plurality or string of microelectromechanical devices. The optical fiber can be multicore or monocore with a plurality of optical terminals configured to detect the light beams and their reflections (as an optical interferometer) in each microelectromechanical device of the device string. Furthermore, the optical fiber media also comprise an optical multiplexer (e.g., a spatial multiplexer) comprising an output connected to the interferometer. Optical interferometry can make use of multiplexing to group all fiber terminations into a single line connected to the interferometer, greatly reducing cabling complexity and weight.

In a first configuration of the electrical voltage measuring device, it is formed as a capacitive cantilever. A cantilever is a structure that can be classified as a beam supported only by one end and without support on the opposite side or cantilever end (mobile cantilever). Said cantilever will constitute a mobile electrode of a capacitive cantilever, the other electrode being fixed and forming a capacitor between electrodes. When an electrical voltage is applied between these two electrodes that form the capacitive cantilever, the mobile electrode will suffer a displacement at the cantilever end due to the electrostatic attraction (or repulsion) force, as a consequence of the applied electrical voltage. The laser is configured to project a light beam through a laser light injection point onto an area of the cantilevered end of the electrode. In this first configuration, the displacement of the electrode comprises the structural deviation $\Delta Z(V)$ of the cantilever end. The displacement of the moving electrode can be precisely measured by the optical processor acting as an optical interferometer.

In a second configuration, the capacitive MEMS comprises a fixed electrode and another electrode fixed at both ends, but with the central part suspended in a vacuum, so that it will be the central part of the suspended electrode that can move based on the electrical voltage applied to it. This configuration is more stable and avoids the possibility of the MEMS collapsing, causing its two electrodes to join together in the event of a power surge or the formation of a spark between the two electrodes. The optical processor functioning as an optical interferometer is configured to project the light beam through a laser light injection point on the moving electrode, and calculate a distance variation $\Delta L(V)$ between the moving electrode and the laser light injection point through optical interferometry in an optical fiber.

BRIEF DESCRIPTION OF THE DRAWINGS

To complement the description being made and in order to help a better understanding of the characteristics of the electrical voltage measuring device according to the present invention, some schematic figures are attached as an integral part of said description where, for illustrative purposes and not limiting, the following has been represented.

DETAILED DESCRIPTION OF THE PREFERRED EMBODIMENTS

Figure 1:
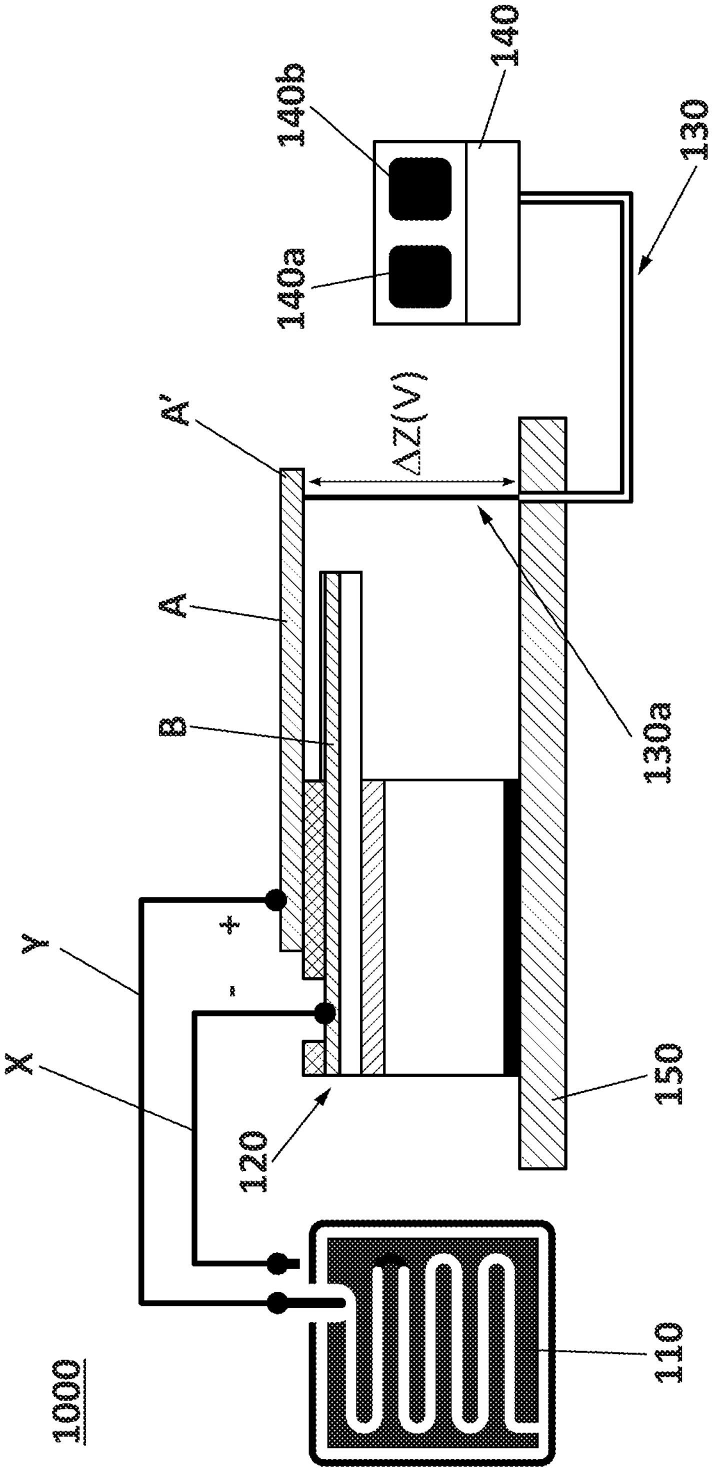
FIG. 1 shows a first example of an electrical voltage measuring device according to the present invention. It comprises a single sensor.

FIG. 1 shows a first example of an electrical voltage measuring device (1000) according to the present invention, comprising a single sensor.

The device (1000) comprises a microelectromechanical device (120), in particular a MEMS powered by an electrical voltage source (110), in particular, a fuel cell whose voltage is to be measured. The MEMS comprises a first electrode (A) (or mobile electrode) and a second electrode (B) (or fixed electrode) connected to an anode (x) and a cathode (y) of the electrical voltage source (110), respectively. The electrical voltage applied to the electrodes causes a structural deviation ΔZ(V) of the first electrode (A) of the MEMS. Said structural deviation ΔZ(V) can be detectable and measured by optical means, in particular, by an optical interferometry system. The sensor comprises a circuit board, PCB (150), on which the MEMS is established. The MEMS is configured to receive a charging electrical voltage from the electrical voltage source (110) causing the structural deviation ΔZ(V) of the first electrode (A) associated with said charging voltage.

The electrical voltage measuring device (1000) also comprises an optical processor (140) connected to an optical fiber (130). The optical fiber (130) may be integrated into the PCB (150). The optical processor (140) may comprise different elements depending on the configuration of the device (1000). In this particular embodiment, the optical processor (140) comprises a laser (140*a*) configured to project a light beam through a laser light injection point on the first electrode (A) through the optical fiber (130) connected to the optical processor (140) and an optical sensor (140*b*) configured to detect the light beam reflected at the fiber-air interface, as well as the light beam reflected on the first electrode (A), where the reflections may vary due to the structural deviation ΔZ(V) of the first electrode (A).

The photonic part of the device (1000) is formed by an interferometric cavity (130*a*), the optical fiber (130) and the optical processor (140) that comprises the laser (140*a*) and the optical sensor (140*b*). The optical processor (140) is the reading unit of the interferometric cavity (130*a*). The optical processor (140) is configured to capture or detect through the optical fiber means (130) the reflections of the light beam emitted by the laser (140*a*) forming interference patterns. The interference patterns based on the light beam and its reflections can vary based on the structural deviation ΔZ(V) of the first electrode (A). From the variation of the interference patterns, the value of the electrical charging voltage of the device sensor (1000) can be derived. Thus, through the optical processor (140), and since the wavelength of the light beam is very short, small changes can be detected in the differences in the optical paths (distance traveled) between the light beam coming from the laser (140*a*) and its reflection (since the differences produce notable changes in the interference pattern).

As can be seen in FIG. 1, for this particular embodiment, the first electrode (A) is configured as a conductive cantilever that comprises a free end or cantilever end (A'). The laser (140*a*) is configured to project the light beam through a laser light injection point over an area of cantilever end (A'). The structural deviation ΔZ(V) of the first electrode (A) includes the deviation of the cantilever end (A'). The laser light injection point may be included in one end of the optical fiber (130).

As can be seen in FIG. 1, the anode (x) and cathode (y) terminals of the fuel cell are connected to the first electrode (A), configured as a conductive cantilever, and to a second electrode (B) in the MEMS, respectively. When the fuel cell applies a voltage to the MEMS, the electrostatic forces caused by said voltage act on the conductive cantilever, causing a structural deviation thereof, ΔZ(V), equivalent to the deviation of the end of the cantilever (A') and this being proportional to the difference in potential or voltage applied by the voltage source in the MEMS. Thus, connecting the anode (x) and the cathode (y) of a fuel cell to the conductive cantilever and the second electrode (B), an attractive force between both causes the structural deviation ΔZ(V) of the end of the cantilever (A') that can be accurately measured through optical interferometry. The structural deviation ΔZ(V) can be correlated with the voltage applied to the MEMS, achieving interferometry patterns through the optical processor (140) that vary based on the voltage differential applied by the fuel cell.

The optical fiber (130) is aligned to project a light beam through a laser light injection point located at the end of the optical fiber (130) in an area of the end of the cantilever (A'). Said light beam and the reflection at the end of the fiber (fiber-air interface) constitute the interferometric cavity (130*a*) and its response is guided by the optical fiber (130) to the optical processor (140), as can be seen in FIG. 1. In particular, the response of the interferometric cavity (130*a*) is read in the optical processor (140), since the interference patterns vary based on the deviation of the end of the cantilever (A').

Figure 2:
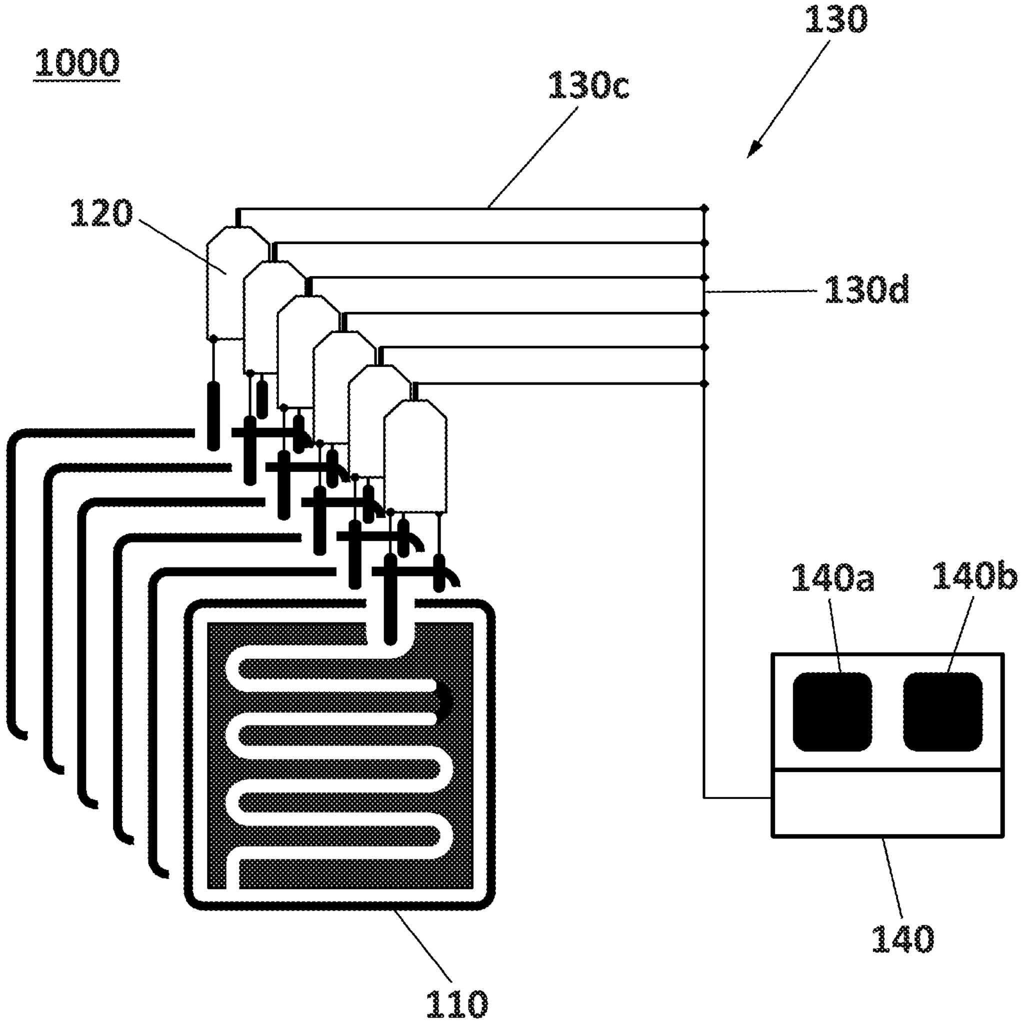
FIG. 2 shows an electrical voltage measuring device according to the present invention comprising a string of microelectromechanical devices.

FIG. 2 shows the scalability property of the electrical voltage measuring device (1000) according to the present invention. FIG. 2 shows a string of MEMS connected to their respective electrical voltage sources (110) and interrogated by a single optical processor (140). The optical fiber (130) comprises a plurality of optical terminals (130*c*) configured to detect the light beams and their reflections in each of the MEMS, as well as an optical multiplexer (130*d*) (which may be a spatial optical multiplexer) connecting the optical processor (140) on one side and the MEMS string on the other. In another example, the optical fiber is a multicore fiber with a plurality of cores configured to transmit the light beam and reflections of the light beam. In this particular embodiment, a plurality of optical terminals (130*c*) are used on the same optical fiber (130), which advantageously reduces the amount of wiring and simplifies the installation and implementation of the device (1000) compared to other existing devices in the state of the art.

Figure 3:
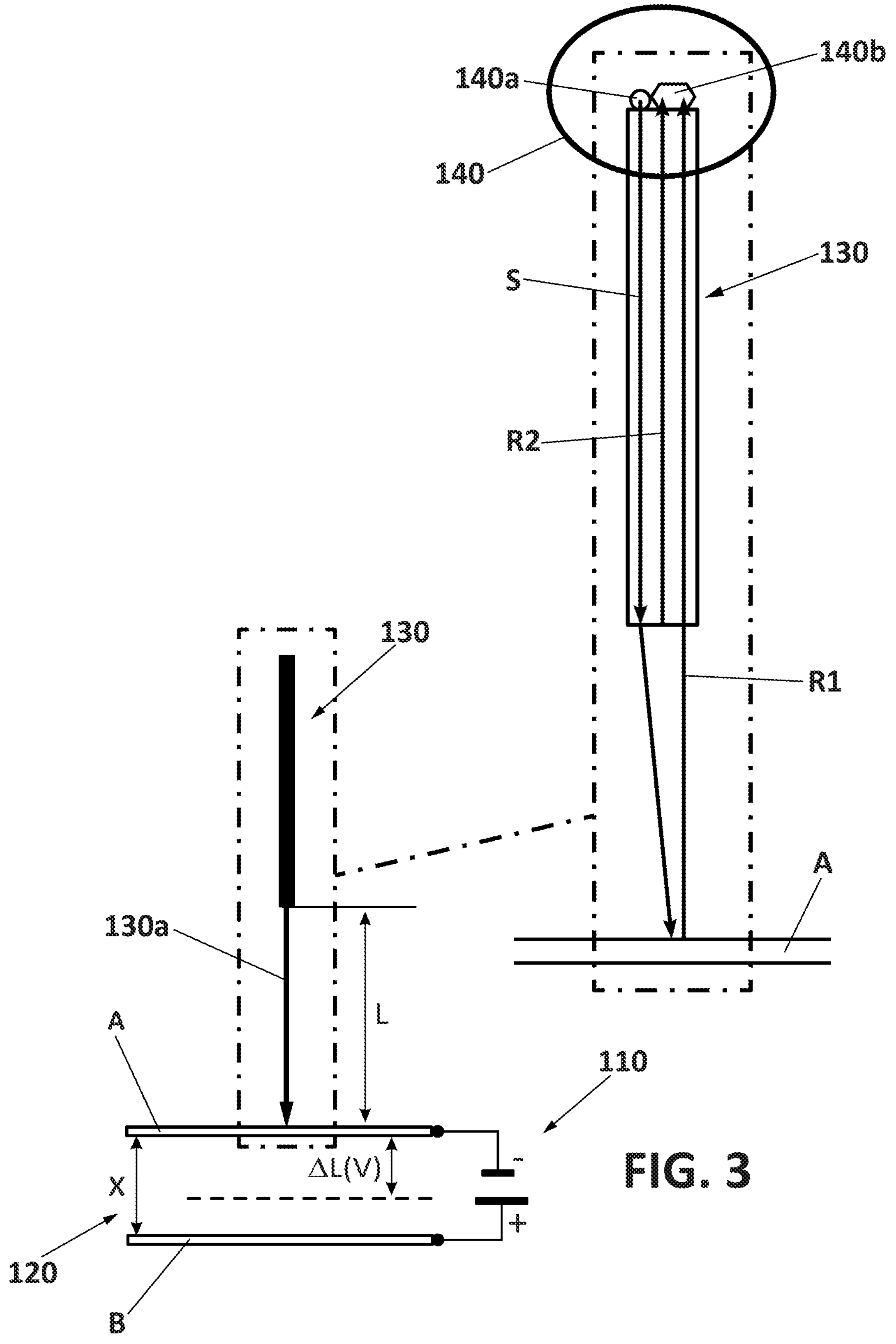
FIG. 3 shows a second example of an electrical voltage measuring device according to the present invention.

FIG. 3 shows another embodiment of the electrical voltage measuring device (1000) according to the present invention. FIG. 3 shows a second configuration where the first electrode (A) comprises a first conductive sheet and the second electrode (B) comprises a second conductive sheet connectable to the anode (x) and the cathode (y) of the electrical voltage source (110). In this second configuration, the first conductive sheet (first electrode) is established on a first surface of the microelectromechanical device (120) and has a fixed position. The second conductive sheet (second electrode (B)), is suspended above the first electrode (A) at a distance X. This second electrode (B) has its two ends fixed to the MEMS structure, however, its central part can move based on the electrical voltage applied between the two electrodes (A, B), due to the electrostatic attraction (or repulsion) force that is generated when the electrical voltage is applied between the two electrodes.

Like the example of FIG. 1, for the embodiment of FIG. 3, the laser (140*a*) is configured to project a light beam onto (optionally, the center of) the second conductive sheet (second electrode (B)) suspended at a distance L between the optical fiber termination (130) and the first conductive sheet. The optical fiber (130) is connected to the optical processor (140) and configured to capture the reflections of the light beam towards the optical processor (140).

Figure 4:
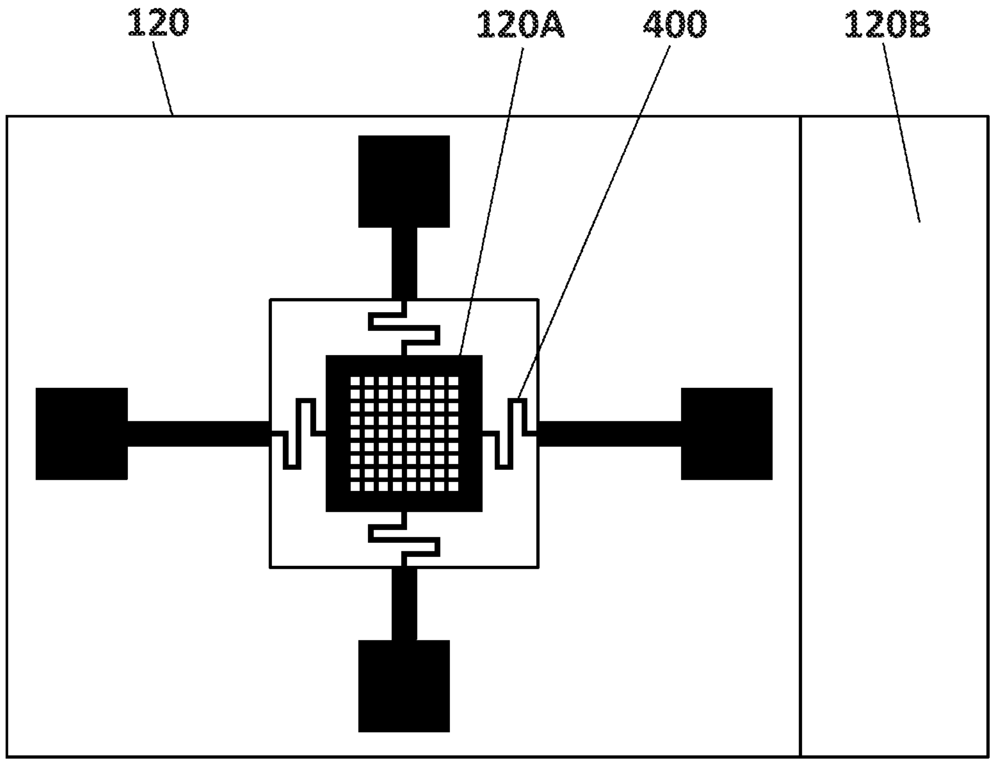
FIG. 4 shows a top view of the second example of the electrical voltage measuring device shown in FIG. 3.

The laser (140*a*) is configured to project the light beam onto the first conductive sheet, suspended, (which can be seen in FIG. 4 in a top view). The center of the first conductive sheet (first electrode (A)) will undergo a displacement based on the applied electrical voltage and where said displacement includes, for this particular embodiment, a distance variation ΔL(V) between the first conductive sheet and the second conductive sheet.

The optical processor (140) is configured to obtain interferometry patterns based on the electrical voltage applied to the conductive sheets of the capacitive MEMS and that causes a distance variation ΔL(V) between the conductive sheets. In the configuration of FIG. 3, when an electrical voltage is applied between the electrodes of the MEMS, the electrostatic attraction force acts on the electrodes causing the distance variation ΔL(V) between both electrodes and the variation of distance between the first conductive sheet and the end of the optical fiber (130).

As can be seen in the zoom view of FIG. 3, the light beam emitted by the laser (140*a*) preferably falls on the center of the first conductive sheet (first electrode A), which is suspended. Both the light beam and the reflection of the light beam are guided to the optical processor (140) through the optical fiber (130). As in the configuration of FIG. 1, the optical processor (140), through the optical detector (140*b*) can accurately measure the distance variation ΔL(V) between the end of the optical fiber (130) and the first conductive sheet (in based on the distance variation) and correlate said variation with the voltage output of the fuel cell.

In this configuration, the laser light beam (140*a*) hits the first conductive sheet at a distance L, it is reflected in the MEMS producing a reflection of the beam that is guided to the optical processor (140) by means of the optical fiber (130). The application of a voltage V causes a displacement of the first electrode (A) equivalent to a distance variation ΔL(V) between the two conductive sheets. Accordingly, the distance between the end of the optical fiber (130) and the first electrode (A) is variable. The optical processor (140) functioning as an interrogator or interferometer can accurately measure the displacement of the MEMS moving electrode and the distance variation, such that:

$$FSR=c/[2*n*L]$$

$$FSR'=c/[2*n*(L+\Delta L(V))]$$

$$\Delta FSR(V)=FSR-FSR'$$

where FSR is the free spectral range observed in the interference pattern obtained by the optical processor (140) at a distance L;

where FSR' is the free spectral range observed in the interference pattern obtained by the optical processor (140) at a distance L+ΔL (V); and where n is the refractive index of the first conductive sheet and c is the speed of light.

Thus, based on the variation of the free spectral range ΔFSR(V), the voltage applied V by the electrical voltage source (110) to the MEMS can be derived.

As can also be seen in the zoom view of FIG. 3, a schematic representation of the light beam emitted (S) by the laser (140*a*) included in the optical processor (140) is shown. Using the optical sensor (140*b*) the interference patterns can be obtained based on:

(1) A first reflection (R1) equivalent to the light beam reflected in the first conductive sheet (first electrode (A)) of the MEMS; and (2) A second reflection (R2) equivalent to the light beam reflected at the interface of the optical fiber (130) with the air. This second reflection (R2) occurs at the end of the optical fiber (130).

The optical fiber (130) is connected to the optical processor (140) and configured to capture the reflections of the light beam towards the optical processor (140): the first reflection (R1) and the second reflection (R2).

In this way, the interference patterns are obtained based on the light beam and its reflections, where the first reflection (R1) is affected by the geometric variations of the MEMS. Thus, the value of the voltage to be measured is obtained based on these interference patterns.

FIG. 4 shows a top view of the second example of the electrical voltage measuring device (1000) shown in FIG. 3, where the first electrode (120A) is a first conductive sheet established above a first surface of the MEMS. In FIG. 4 it can be seen how the center of the first conductive sheet (120A) is suspended above the first surface of the MEMS and above the lower electrode (120B). Said first conductive sheet is fixed to the first surface at its ends (400), but in its central part the conductive sheet is suspended over the first surface and above the lower electrode. In another example the first sheet is suspended by elastic means. The second electrode (120B) comprises a second conductive sheet established on a second surface of the microelectromechanical device (120), lower than the first conductive sheet.

Figure 5:
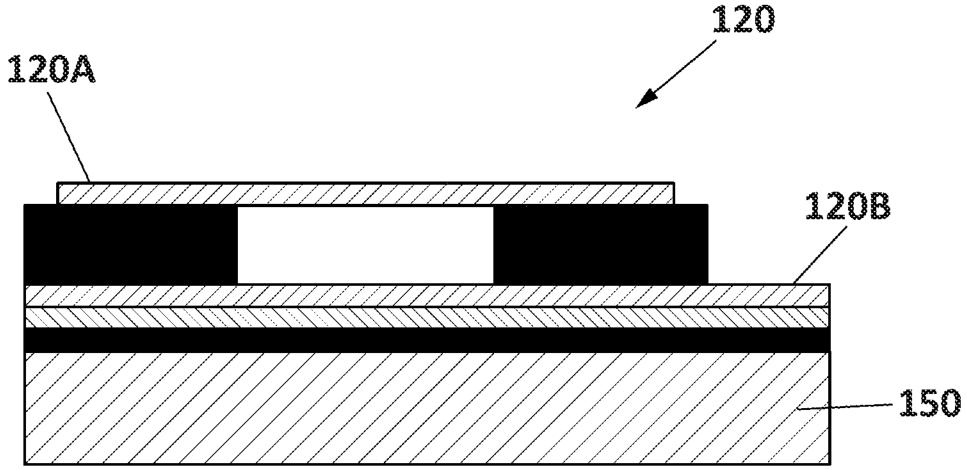
FIG. 5 shows a sectional view of the second example of the electrical voltage measuring device shown in FIG. 4.

FIG. 5 shows a sectional view of the second example of the electrical voltage measuring device shown in FIG. 4. In FIG. 5 it can be seen the microelectromechanical device (120), for example, a MEMS, comprising the first electrode (120A) which is a first conductive sheet established above a first MEMS surface. In FIG. 5 it can be seen how the center of the first conductive sheet (120A) is suspended above the first surface of the MEMS and above the lower electrode (120B). This first conductive sheet is fixed to the first surface at its ends, but in its central part the conductive sheet is suspended over the first surface and above the lower electrode (120B). The second electrode (120B) comprises a second conductive sheet established on a second surface of the microelectromechanical device (120), lower than the first conductive sheet. The microelectromechanical device (120) is established on the PCB board (150).

The systems and devices described herein may include a controller or a computing device comprising a processing and a memory which has stored therein computer-executable instructions for implementing the processes described herein. The processing unit may comprise any suitable devices configured to cause a series of steps to be performed so as to implement the method such that instructions, when executed by the computing device or other programmable apparatus, may cause the functions/acts/steps specified in the methods described herein to be executed. The processing unit may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory may be any suitable known or other machine-readable storage medium. The memory may comprise non-transitory computer readable storage medium such as, for example, but not limited to, an electronic, magnetic, optical, electromagnetic, infrared, or semiconductor system, apparatus, or device, or any suitable combination of the foregoing. The memory may include a suitable combination of any type of computer memory that is located either internally or externally to the device such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. The memory may comprise any storage means (e.g., devices) suitable for retrievably storing the computer-executable instructions executable by processing unit.

The methods and systems described herein may be implemented in a high-level procedural or object-oriented programming or scripting language, or a combination thereof, to communicate with or assist in the operation of the controller or computing device. Alternatively, the methods and systems described herein may be implemented in assembly or machine language. The language may be a compiled or interpreted language. Program code for implementing the methods and systems described herein may be stored on the storage media or the device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein.

Computer-executable instructions may be in many forms, including modules, executed by one or more computers or other devices. Generally, modules include routines, programs, objects, components, data structures, etc., that perform particular tasks or implement particular abstract data types. Typically, the functionality of the modules may be combined or distributed as desired in various embodiments.

It will be appreciated that the systems and devices and components thereof may utilize communication through any of various network protocols such as TCP/IP, Ethernet, FTP, HTTP and the like, and/or through various wireless communication technologies such as GSM, CDMA, Wi-Fi, and WiMAX, is and the various computing devices described herein may be configured to communicate using any of these network protocols or technologies.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electrical voltage measuring device, comprising:

at least one microelectromechanical device comprising a first electrode configured to be connected to an anode of an electrical voltage source and a second electrode configured to be connected to a cathode of said electrical voltage source such the first electrode is configured to be movable and the second electrode is configured to be non-movable, wherein the microelectromechanical device is configured to receive an electrical voltage from the electrical voltage source causing a displacement of the first electrode associated with said electrical voltage, wherein said displacement causes a variation of distance between the first electrode and the second electrode; and an optical processor comprising a laser and an optical sensor, the optical processor configured to:

project, using the laser, a light beam through a laser light injection point on the first electrode such that the light beam is projected onto an inner surface of the first electrode between the first electrode and the second electrode;

detect with the optical sensor reflections of the light beam, wherein a distance variation between the first electrode and the laser light injection point generates a variation of at least one reflection of the light beam;

obtain interference patterns based on the light beam and the at least one reflection of the light beam; and calculate a value of the electrical voltage applied to the first electrode and the second electrode based on the interference patterns.

2. The electrical voltage measuring device according to claim 1, further comprising:

at least one optical fiber connected to the optical processor, wherein one end of the optical fiber comprises the laser light injection point, and wherein the optical fiber is configured to transmit the light beam and reflections of the light beam.

3. The electrical voltage measuring device according to claim 2, further comprising:

a printed circuit board (PCB) wherein at least the one end of the optical fiber comprising the laser light introduction point is integrated into the PCB.

4. The electrical voltage measuring device according to claim 3, wherein the distance variation is measured as a distance between the laser light introduction point of the PCB and the inner surface of the first electrode.

5. The electrical voltage measuring device according to claim 2, wherein the optical fiber is a multicore fiber with a plurality of cores configured to transmit the light beam and the reflections of the light beam, and an optical multiplexer comprising an output connected to the optical processor.

6. The electrical voltage measuring device according to claim 2, wherein the optical fiber is a monocore fiber with a plurality of optical terminals configured to transmit the light beam and the reflections of the light beam and an optical multiplexer comprising an output connected to the optical processor, and wherein the optical multiplexer is spatial.

7. The electrical voltage measuring device according to claim 1, wherein the first electrode is configured as a conductive cantilever and comprises a cantilever end, wherein the cantilever end is a free end, wherein the laser is configured to project the light beam to an area of the cantilever end, and wherein the deviation of the first electrode comprises a structural deviation $\Delta Z(V)$ of the cantilever end at least partially parallel to the light beam.

8. The electrical voltage measuring device according to claim 7, wherein the inner surface of the first electrode in which the light beam is projected is at the area of the cantilever end of the first electrode and wherein the light beam is projected such that the light beam is only projected onto the first electrode at the inner surface.

9. The electrical voltage measuring device according to claim 1, wherein the first electrode comprises a first conductive sheet comprising a center suspended above a first surface of the microelectromechanical device, the first electrode being fixed only at its ends, wherein the second electrode comprises a second conductive sheet, wherein the first conductive sheet is above the second conductive sheet, wherein the laser is configured to project the light beam onto the first conductive sheet at a distance L between the laser light injection point and the first conductive sheet, and wherein a deviation of the first electrode comprises a distance variation $\Delta L(V)$ between the first conductive sheet and the laser light injection point.

10. The electrical voltage measuring device according to claim 1, wherein the microelectromechanical device comprises a capacitive MEMS.

11. A system comprising:

the electrical voltage measuring device according to claim 1; and at least one electrical voltage source.

12. The system according to claim 11, wherein the electrical voltage source is a fuel cell or a battery.

* * * * *